United States Patent [19]

Hasbun et al.

[11] Patent Number: 5,740,349
[45] Date of Patent: Apr. 14, 1998

[54] METHOD AND APPARATUS FOR RELIABLY STORING DEFECT INFORMATION IN FLASH DISK MEMORIES

[75] Inventors: Robert N. Hasbun, Shingle Springs; Steven E. Wells, Citrus Heights, both of Calif.

[73] Assignee: Intel Corporation, Santa Clara, Calif.

[21] Appl. No.: 481,927

[22] Filed: Jun. 7, 1995

Related U.S. Application Data

[63] Continuation of Ser. No. 19,768, Feb. 19, 1993, abandoned.

[51] Int. Cl.[6] ............................................. G06F 11/00
[52] U.S. Cl. ........................... 395/182.06; 371/10.2; 371/21.6
[58] Field of Search ........................ 395/775, 500, 395/182.06, 430, 483; 371/10.1, 10.2, 11.1, 21.6; 365/900

[56] References Cited

U.S. PATENT DOCUMENTS

| | | | |
|---|---|---|---|
| 4,642,759 | 2/1987 | Foster | 395/500 |
| 4,644,494 | 2/1987 | Muller | 395/425 |
| 4,763,305 | 8/1988 | Kuo | 365/200 |
| 4,802,117 | 1/1989 | Chrosny et al. | 371/10 |
| 4,896,262 | 1/1990 | Wayama et al. | 395/500 |
| 4,924,327 | 5/1990 | Seamons et al. | 360/48 |
| 4,958,315 | 9/1990 | Balch | 395/500 |
| 5,012,425 | 4/1991 | Brown | 364/464.02 |
| 5,047,989 | 9/1991 | Canepa et al. | 365/238.5 |
| 5,070,474 | 12/1991 | Tuma et al. | 395/500 |
| 5,077,737 | 12/1991 | Leger et al. | 371/10.1 |
| 5,101,490 | 3/1992 | Getson, Jr. et al. | 395/425 |
| 5,111,385 | 5/1992 | Hattori | 395/425 |
| 5,131,089 | 7/1992 | Cole | 395/500 |
| 5,199,033 | 3/1993 | McGeoch et al. | 371/10.1 |
| 5,200,959 | 4/1993 | Gross et al. | 371/21.6 |
| 5,224,070 | 6/1993 | Fandrich et al. | 365/185 |
| 5,270,979 | 12/1993 | Harari et al. | 365/218 |
| 5,274,829 | 12/1993 | Hotta et al. | 395/775 |
| 5,291,584 | 3/1994 | Challa et al. | 395/500 |
| 5,341,339 | 8/1994 | Wells | 365/218 |
| 5,359,569 | 10/1994 | Fujita et al. | 365/229 |
| 5,359,570 | 10/1994 | Hsu et al. | 365/230.01 |
| 5,359,726 | 10/1994 | Thomas | 395/500 |
| 5,361,343 | 11/1994 | Kosonocky et al. | 395/425 |
| 5,418,752 | 5/1995 | Harari et al. | 365/218 |
| 5,524,230 | 6/1996 | Sakaue et al. | |
| 5,602,987 | 2/1997 | Harari et al. | |

FOREIGN PATENT DOCUMENTS

| | | | |
|---|---|---|---|
| 2088442 | 7/1993 | Canada | 13/16 |
| 0175458A2 | 3/1986 | European Pat. Off. | G06F 12/08 |
| 0392895 | 10/1990 | European Pat. Off. | 16/6 |
| 2251323 | 1/1992 | United Kingdom | 12/2 |
| 2251324 | 1/1992 | United Kingdom | 12/2 |

OTHER PUBLICATIONS

Robinson, Kurt, "Trends in Flash Memory System Design", *Wescon Conference Record*, Nov. 1990, pp. 468–472.

Walter Chen, Reprint of "Flash: Big News in Storage?", Nov./Dec. 1992 Edition of Storage Magazine, pp. 10–4 through 10–7.

*Primary Examiner*—Jack B. Harvey
*Assistant Examiner*—Paul R. Myers
*Attorney, Agent, or Firm*—Blakely, Sokoloff, Taylor & Zafman

[57] ABSTRACT

A controller for controlling associated circuitry which includes a microprocessor, read only memory for storing control processes to be run by the microprocessor for controlling the associated circuitry, random access memory, and means for accessing the associated circuitry, by a process which detects changes in the associated circuitry during operation of the associated circuitry, and writes those changes to the read only memory so that they are available to the controller should power be lost during the operation of the associated circuitry.

17 Claims, 7 Drawing Sheets

METHOD AND APPARATUS FOR RELIABLY STORING DEFECT INFORMATION IN FLASH DISK MEMORIES

This is a continuation of application Ser. No. 08/019,768, filed Feb. 19, 1993 now abandoned.

BACKGROUND OF THE INVENTION

1. Field of the Invention

This invention relates to computer memory arrangements and, more particularly, to methods for managing defects which occur during the operation of flash electrically erasable programmable read only memory (flash EEPROM) arrays.

2. History of the Prior Art

Modern computer systems make extensive use of long term memory. Typically this memory is provided by one or more electro-mechanical hard (fixed) disks which utilize rapidly rotating flat circular disks coated with magnetic material to store data in positions on the disks. These positions lie in circular tracks which are divided into sectors, a number of which (e.g., seventeen) form one complete track on one side of a disk. Each sector is capable of storing a fixed mount of data which is typical 512 bytes (256, 1024 or larger byte sectors are used in some disks). Depending on formatting, a single side of a disk may have over six hundred tracks. A typical disk drive used in personal computers today is capable of storing forty megabytes of data.

Such electro-mechanical disk drives are very useful and have become almost a necessity to the operation of personal computers. However, such electro-mechanical drives do have their drawbacks. They are relatively heavy and increase the weight of a computer, especially a portable computer, significantly. They also are relatively bulky and require a significant mount of space within a computer. Their use requires a significant mount of the power and in a portable computer leads to significant battery power consumption. More importantly, electro-mechanical hard disk drives are very susceptible to shock. A hard drive within a portable computer which is dropped is quite likely to cease functioning. This can cause a catastrophic loss of data.

Recently, forms of long term storage other than electro-mechanical hard disks have become feasible for use in computers. One of these forms of long term storage is called flash EEPROM. A flash EEPROM memory array is comprised of a large plurality of floating-gate metal-oxide-silicon field effect transistors arranged as memory cells in typical row and column fashion with circuitry for accessing individual cells and placing the memory transistors of those cells in one of two memory conditions. A flash EEPROM memory cell, like a typical EPROM cell but in contrast to DRAM memory, retains information when power is removed. A flash EEPROM array has a number of characteristics which adapt it to use as long term memory. It is light in weight, occupies very little space, and consumes less power than electro-mechanical disk drives. More importantly, it is especially rugged. It will withstand without adverse effects repeated drops each of which would destroy a typical electromechanical hard disk.

A peculiarity of flash EEPROM is that it must be erased before it can be rewritten. A flash EEPROM array is erased by applying a high voltage simultaneously to the source terminals of all of the transistors (cells) used in the memory (or some sub-portion of the memory). Because these source terminals are all connected to one another by electrical busing paths in the array, the entire portion must be erased at once. While a controller for an electro-mechanical hard disk will typically store information in a first area of the disk and then rewrite that same area of the disk when the information changes by simply changing the magnetic condition of the positions, this is not possible with a flash memory array without erasing all of the valid information that remains in the erased portion of the array along with the invalid (dirty) information.

Because of this, a different arrangement is used for programming and erasing sectors of a flash EEPROM array. First, the entire array is divided into smaller separately erasable blocks so that when a block is erased the amount of valid data which must be reprogrammed is reduced. Then, when the information at a data entry changes, the changed information is written to a new sector on an available block rather than written over the old data; and the old data is marked dirty. When erasure occurs, all of the valid data in the block to be erased is written to a new block; and then the dirty block is erased and put back into use as a clean block of memory. Because of this involved erasure process, it typically takes as much as two seconds or more to erase a flash EEPROM array. However, because erasure need not occur with each entry which is rewritten, erasure may be delayed until a block contains a sufficient amount of dirty information that erasure is feasible. This reduces the number of erasure operations to a minimum and allows erasure to occur in the background when the facilities for controlling the array are not otherwise occupied with reading and writing.

The details of a new flash EEPROM array designed in the manner described above are disclosed is U.S. patent application Ser. No. 07/969, 131, entitled Method and Circuitry for a Solid State Memory Disk, S. Wells et al, filed on Oct. 30, 1992, and assigned to the assignee of the present invention.

The requirement for free space to write to when data changes and when a block having dirty sectors is erased means that space in the data array must be available for these purposes at all times or the array will not function. This places a heavy burden on the management of the space available in the flash EEPROM memory array.

As with other memory arrangements, failures of flash EEPROM memory arrays can occur; and means must be provided for dealing with such failures as they occur. Certain apparent failures which flash memory arrays may experience are, in fact, typical of the operation of transistor memory devices. Many of these failures are not, in fact, failures of the memory devices or of the array. Consequently, to disable the array or a section of the array on the occurrence of such errors would be to disable circuitry capable of continued use. This is especially undesirable in memory such as flash memory which continually uses free space for writing and erasure operations. Other failures are such that some part of the array is no longer usable and should be taken out of use, preserving the data therein as well as possible. For this reason, it is desirable that the various types of failures which appear to occur in a flash memory array be handled in a manner which preserves the data stored in the array by the host while at the same time preserving the array itself for further operation. An arrangement for managing the defects which occur in a flash EEPROM memory array disclosed in U.S. patent application Ser. No. 07/969,749, entitled Method For Managing Defects In Flash Disk Memories, S. Wells et al, filed Oct. 30, 1992, and assigned to the assignee of the present invention.

A problem of that method for managing defects is that identical information regarding bad blocks of the array is stored in defect tables on each of the chips of the array. When power is applied to the array, the defect tables stored on the individual chips are read, and data in a majority of all of these tables are used to indicate which individual blocks are bad. From this information a table is generated in random access memory and used in controlling the array.

This method has a number of unfortunate problems. If more than fifty percent of the blocks storing the defect tables are bad, then the system of determining bad blocks does not work. The system requires that all of the circuitry for accessing the blocks be functioning correctly in order to obtain a valid result. If the accessing circuitry is bad, the arrangement will not work. Further, data regarding the failure cannot be retrieved for testing purposes if the addressing circuitry has failed. The arrangement uses space on each block of the array which could be used for other purposes. It also requires that all blocks, both good and bad, be interrogated at startup in order to determine which blocks are to be ignored. Each time a bad block is detected, the information must be stored in a large number of defect tables. These operations take extra operational time.

SUMMARY OF THE INVENTION

It is, therefore, an object of the present invention to provide a new arrangement for storing data indicating defects detected during the operation of the flash memory array.

It is another more specific object of the present invention to provide a method by which defects in the flash memory array may be reliably stored for the management of blocks of flash EEPROM memory.

These and other objects of the present invention are realized in a controller for a memory array which includes a microprocessor, read only memory for storing control processes to be run by the microprocessor for controlling the memory array, random access memory, and means for accessing the array, by a process which detects changes in the array during operation of the array, and writes those changes to read only memory apart from the array so that they are available to the controller should power be lost during the operation of the array.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer or a portion thereof and the method of computation itself should be borne in mind. The present invention relates to apparatus and to method steps for operating a computer in processing electrical or other (e.g. mechanical, chemical) physical signals to generate other desired physical signals.

DETAILED DESCRIPTION

Figure 1:
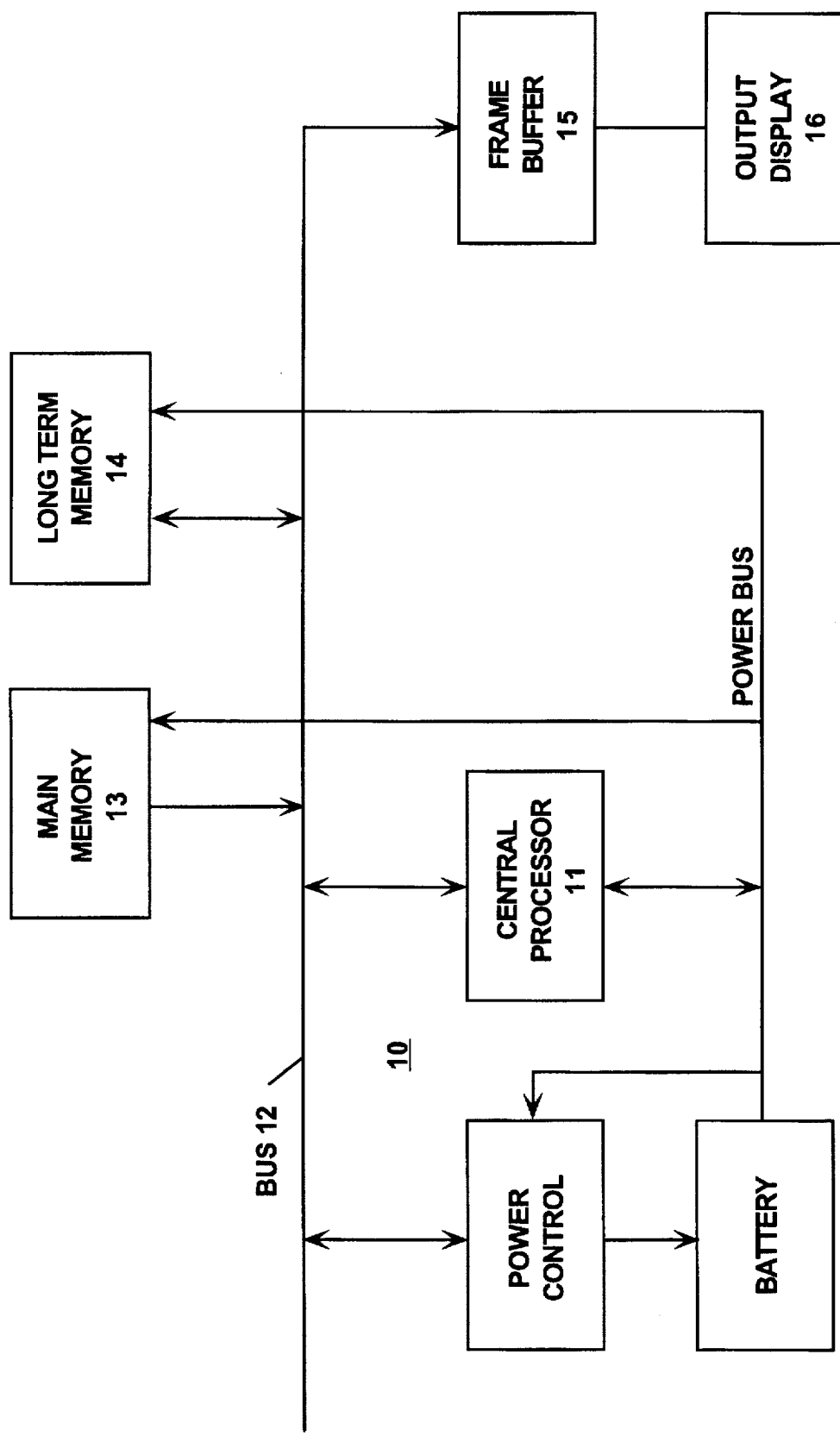
FIG. 1 is a block diagram illustrating a computer system which may include the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Also connected to the bus 12 is main memory 13 which is typically constructed of dynamic random access memory arranged in a manner well known to those skilled in the prior art to store information being used by the central processor during the period in which power is provided to the system 10.

Also connected to the bus 12 are various peripheral components such as long term memory 14. Although long term memory 14 is typically provided by one or more electro-mechanical hard disk drives, such memory may also comprise flash EEPROM memory arrays constructed in a manner to replace the typical electro-mechanical hard disk drives. Such a flash EEPROM memory array is utilized in practicing the present invention. In addition to long term memory 14 and other peripheral components, circuitry may also be coupled to the bus 12 such as a frame buffer 15 to which data may be written for transfer to an output display device 16. Circuitry well known to those skilled in the art may also be utilized to provide power for portable computers in which the present invention is expected to find substantial use.

As outlined above, a flash EEPROM memory array includes a large plurality of transistors arranged as memory cells in an array with circuitry for accessing individual cells and placing the memory transistors of those cells in one of two memory conditions. A flash memory cell, like a typical EPROM cell, retains information when power is removed. However, unlike the typical EPROM cell, a flash EEPROM cell may be electrically erased in place.

Because flash EEPROM cannot be reprogrammed until it has been erased and because only large portions of such an array can be erased at any time, all of the valid information that remains in a portion of the array which is to be erased must be rewritten to some other area of the array each time the portion of the array is erased or it will be erased along with the invalid "dirty" information in the portion of the array being erased. Since the running of the erase process requires the rewriting of all valid data, the preconditioning of the memory cells before erase, and post erasure repair, the erase process is quite slow; it typically requires between one and two seconds to erase a flash EEPROM array. Such an erase time would seem to preclude the use of flash EEPROM for rapidly changing data.

However, flash EEPROM may be used for long term storage of the rapidly changing data typically stored by an electro-mechanical hard disk if some method of erasing and rewriting the flash array is devised which is different than that typically used for electro-mechanical hard disks and does not slow the overall operation of the system.

In the new arrangement for erasing and rewriting a flash EEPROM array disclosed in the U.S. patent application entitled Method and Circuitry for a Solid State Memory Disk, referred to above, a long term storage array is comprised of flash memory arranged in a series of blocks, each of which blocks is independently erasable. In one embodiment, the array is divided into a number of silicon chips each of which is subdivided into sixteen sub-blocks. Each sub-block is, in fact, physically paired with a sub-block on another of the silicon chips to create a logical block of the array in which odd bytes of data are stored on the sub-block of one chip and even bytes of data are stored on the sub-block of the other chip. Each of the logical blocks of flash memory is separately erasable from all other such blocks. However, each of the logical blocks of the array typically holds 128 kilobytes of data, sufficient to hold 256 sectors of information normally stored on the tracks of an electro-mechanical hard disk drive. Thus, a thirty chip (fifteen chip pairs) flash memory array with sixteen individually-erasable sub-blocks per chip holds about the same amount of data as does a thirty megabyte electro-mechanical hard disk. Even with this division of data into 240 individually-erasable blocks, erasure of a block effects erasure of such a very large amount of information that to attempt to erase all of the data and then replace the valid data by rewriting each sector each time data is updated would be a practical impossibility.

In order to overcome this problem, in the new arrangement referred to above, data is written to any physical block of the flash memory array which has space available. Thus, data is written to an empty position in the array no matter what the apparent address of the data or the address on the block. A piece of data is written to the next available sector of the block being written, and a lookup table is kept which records the physical position on the block with the logical address. This arrangement of the array allows a first block to be written sector by sector, a second block to be written in the same sequential manner, and so on. When the data in a sector changes so that the sector needs to be rewritten, the data is written to a new physical position, the data in the lookup table is changed to record the new physical position along with the logical sector number, and the first position at which the data was written is marked as dirty. After some period of time, a sufficient number of blocks will be filled that it will be desirable to release space by moving the valid information from some especially dirty block to some other block and erasing the entire block from which the valid information has been moved. This has the effect of freeing up an additional number of sectors equal to all of the sectors on the erased block which have previously been marked as dirty.

An especial advantage of the arrangement is that it allows the erasure of blocks to occur in the background. That is, erasure may be arranged to occur when the facilities of the array are not otherwise occupied with reading and writing. In this manner, the external host which is writing to and receiving information from the flash array is typically not aware that an erasure is taking place even though the erasure requires one or two seconds.

Figure 2:
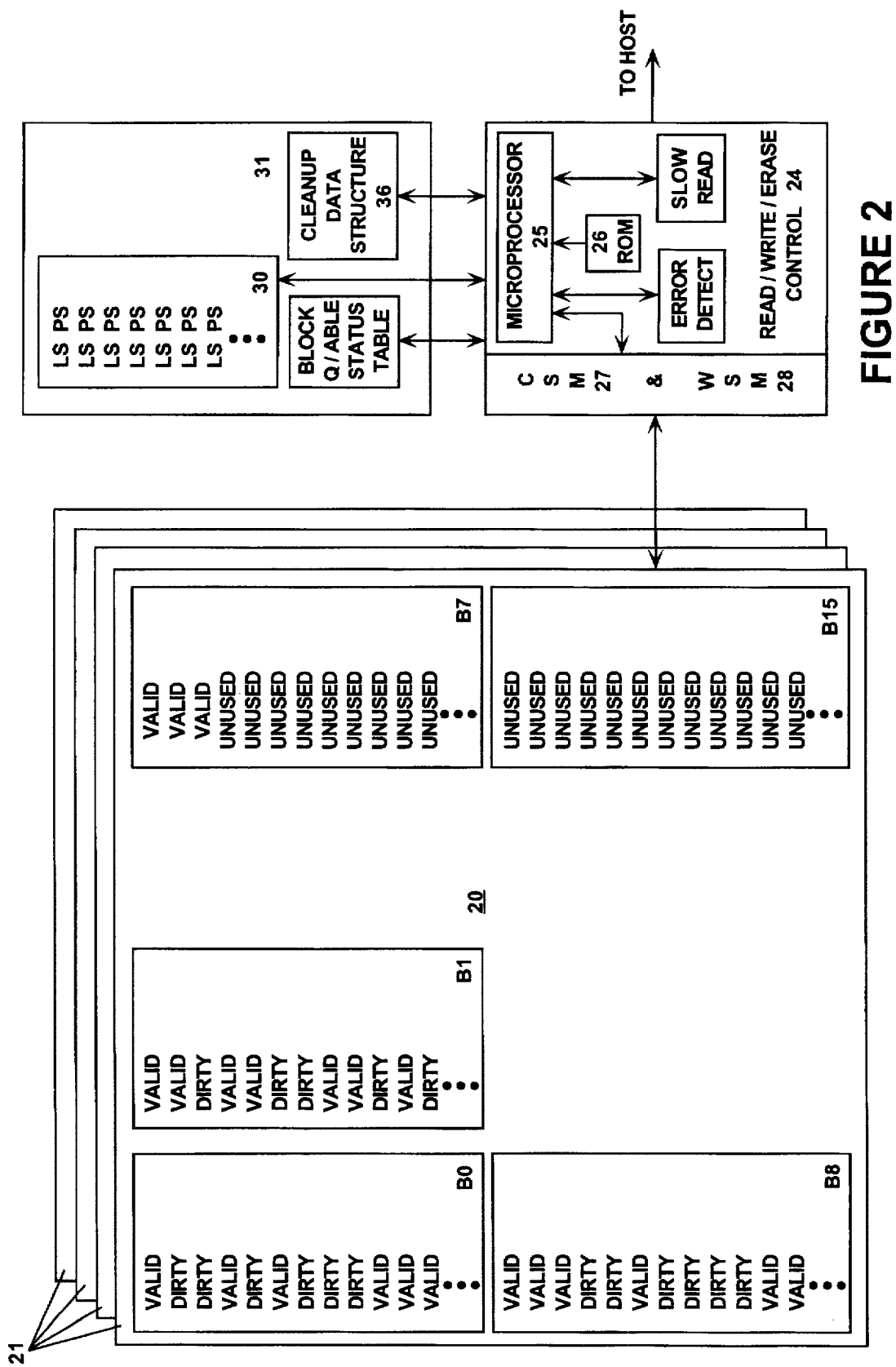
FIG. 2 is a block diagram illustrating the layout of a flash memory array in which the present invention may be utilized.

Referring now to FIG. 2, there is illustrated in block diagram form a flash EEPROM memory array 20 in which the present invention may be practiced. The array 20 includes a plurality of blocks B0-B15 of flash EEPROM memory. Each block includes floating-gate field effect transistor memory cells (not shown) arranged in typical row and column fashion and having circuitry arranged for selecting any particular block of memory and any particular row and column so that the memory device at that position may be written or read. The details of the layout of transistor memory arrays and the associated accessing circuitry are well known to those skilled in the art and are, therefore, not shown here.

Flash memory is essentially an EPROM array with facilities provided so that the entire array (or an individually erasable block) may be erased by a high voltage value applied simultaneously to the source terminals of all the memory transistors of the array with the other terminals suitably biased. Such an erasure places each of the cells in the one condition. When in that condition, a zero or a one may be written to a cell. A one leaves the cell in the same one condition while a zero switches the cell to the zero condition. A cell cannot be switched back from the zero condition to the one condition without the application at its source terminal of the high value of voltage (Vpp) required for erasure. Since the source terminals of all of the memory transistors in a block are joined together, a cell in a zero state remains in that state until the entire block is erased once again.

In the array 20 of FIG. 2, blocks B0-B15 of memory are illustrated positioned on a first chip 21 of the array 20. Additional silicon chips 21 (e.g., thirty) each hold additional blocks of the array 20 to provide a total of 240 blocks in one embodiment. In that embodiment, any block is actually constructed of a pair of sub-blocks which may be positioned on adjacent chips. The sub-blocks have input, output, and selection conductors such that odd bytes of data are stored in one sub-block and even bytes of data on the other sub-block. From this point on in this description, a block may be considered to include such a pair of sub-blocks.

Once any one of the blocks has been erased, data may be written to any position on the entire block. The operations of reading, writing, and erasing the array 20 are controlled by a control circuit 24 which receives commands and data from the host. The control circuit 24 includes among other things a microprocessor 25 and read only memory 26 which may store processes for operating the microprocessor to accomplish the various control operations described in this specification. In one embodiment of the invention, the read only memory 26 is also a flash EEPROM memory array. The microprocessor 25 and read only memory 26 are used to carry out the processes in accordance with the present invention. For the purpose of this invention, the control circuit 24 may also be considered to include a command state machine 27 and a write state machine 28. Although discussed as a part of the control circuit 24, in one embodiment the command state machine 27 and the write state machine 28 are physically a part of each chip 21.

The microprocessor 25 of the control circuit 24 runs the various processes stored in the read only memory 26 to control and manage the reading, writing, and erasure of the array 20. The command state machine 27 provides a command interface between the control circuit 24 and the flash EEPROM memory array 20. The command state machine 27 controls the actual transfer of all data sent to and from the flash memory array 20. The command state machine 27 sequences the data transferred from the host (using the write state machine 28) and to the host so that the writing to and reading from the array 20 occur in proper order. A command state machine 27 and a write state machine 28 used for these purposes are described in detail in U.S. patent application Ser. No. 07/655,643, entitled Command State Machine, Fandrich et al, filed Feb. 11, 1991, and assigned to the assignee of the present invention, and in U.S. patent application Ser. No. 07/654,375, entitled Circuitry and Method For Programming and Erasing A Non-volatile Semiconductor Memory, Kynett et al, filed Feb. 11, 1991, and assigned to the assignee of the present invention.

When a host begins writing data to be stored in the array 20 to some block of the array which has been completely erased, the data to be stored is written sequentially, sector by sector, to that block until that block has been filled with data. Then writing proceeds to the next sequential block having free space. At any point after writing is completed, the information may be read back from the array 20 by interrogating the block and sector at which the data is stored.

In accordance with the arrangement described above, the data is stored in logical sectors which are similar to the physical sectors utilized in storing data on the typical electro-mechanical hard disks of the prior art except that the sectors may be of any size. When the data in a sector changes, the changed data is written to a new empty sector location on some one of the blocks of the array 20, typically the next empty sector location in physical sequence. This, rather than writing over the old information, occurs because the old information can only be rewritten if the entire block on which it is stored is erased. Consequently, the new information is written to a new position on an untilled block (e.g., block B7), and the old position is marked invalid (dirty) by writing zeroes with the data stored (in a manner to be explained below) to indicate that the data is invalid. It will be recognized that a value of zero may be written to any memory cell without erasing the block of the array.

Because of the arrangement by which data is replaced, the sector number which is used to indicate where data is stored is a logical sector number rather than a physical sector number. This should be contrasted with the physical sector number used to arrange data on the typical electro-mechanical hard disk. In order to allow this to occur, a lookup table 30 (which is stored in a part of a random access memory 31 associated with the controller 24) is utilized with the array 20 so that the physical position in the array 20 at which any particular logical sector exists may be determined.

Also, because of this arrangement by which data is replaced, each block of the array 20 will after some time have a number of entries which are marked dirty and cannot be used for storage. Consequently, the array 20 fills with data as the data previously stored is changed; and a point will come when it is necessary to clear the dirty information from a block in order to provide space for new or changed information to be stored. Typically, the dirtiest block of the array 20 is chosen for erasure. This allows the smallest amount of data to be moved out to another block of the array since the invalid data need not be moved. Once the valid information is written to another block and the new addresses are recorded in the lookup table 30, the block from which the information was read is erased. It is then placed back in operation as an entirely clean block. In order to allow this "cleanup" operation to occur, some number of blocks must be kept in reserve to be used when cleanup is necessary.

Figure 3:
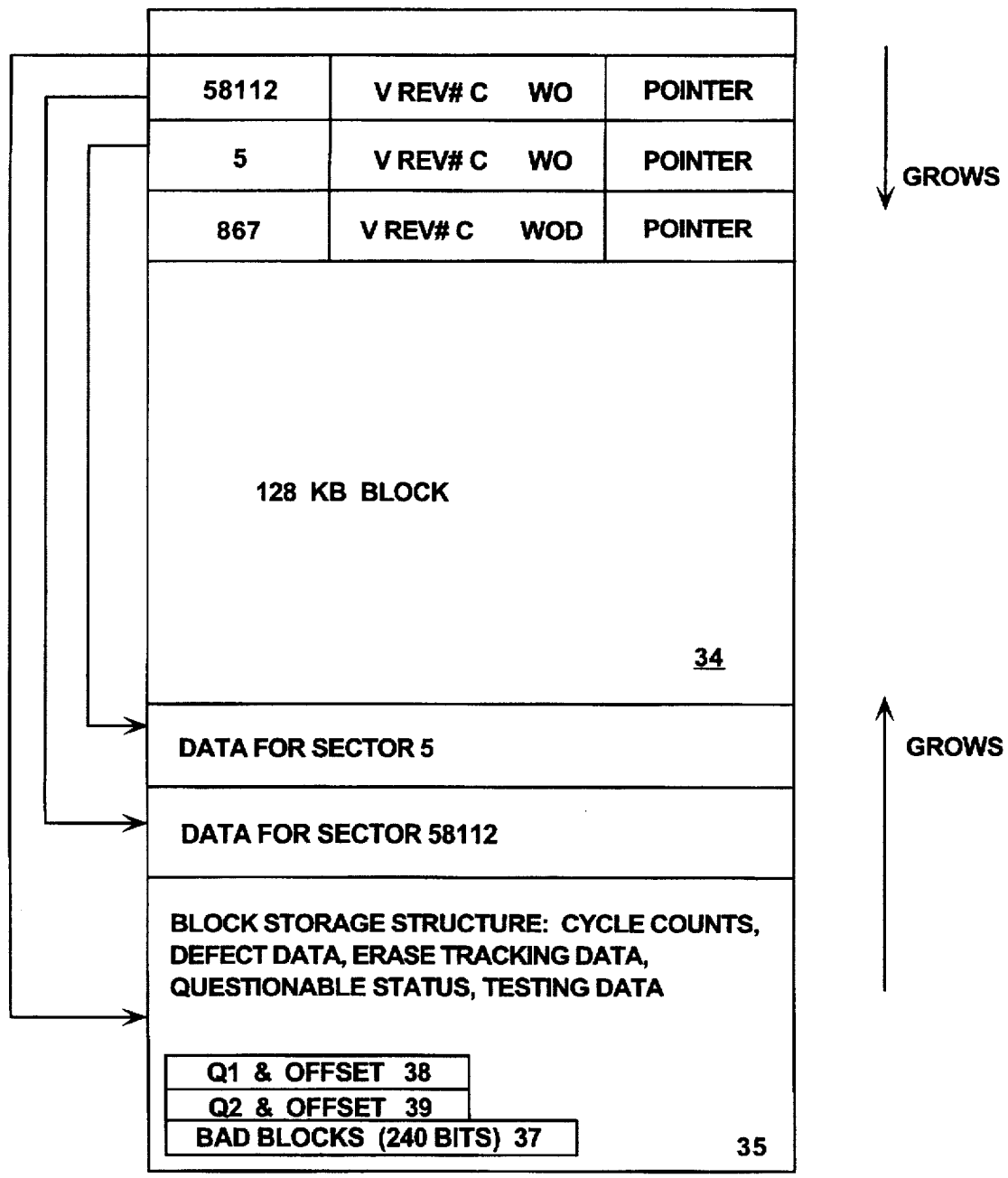
FIG. 3 is a block diagram illustrating a pattern for storage of information on a single block of a flash memory array such as that illustrated in FIG. 2.

FIG. 3 illustrates a logical arrangement used for an individual block in order to obtain the advantages discussed above. FIG. 3 is an idealized drawing useful in understanding the way data is stored on each block of the array 20. FIG. 3 illustrates a typical block 34 as a rectangle. The rectangular area includes a plurality of transistor devices arranged to provide the 128 kilobytes of storage which each block provides. The individual transistors and the various column and row select lines and other conductors for operating the block are not illustrated but are well known to those skilled in the art of designing flash memory.

As may be seen in FIG. 3, data is stored in the block 20 beginning at the top of the block and close to the bottom. At the top of the block 34 are stored in identification fields called sector translation tables (or headers) the logical sector numbers used by the operating system as addresses for the data. For example, a first sector number 58112 is stored in the header for the first entry at the top. Following the sector number in each header are stored various attribute bits and a pointer value. The attributes included in one embodiment are an indication of the validity of the entry, a revision number, an indication whether the data is compressed or not, and a bit which indicates whether the entry includes data. The indication of the validity of the entry stores at least one bit which indicates valid when it is a one value and invalid when it is a zero value; this bit may be duplicated to better assure a correct validity is stored. The revision number is, in one embodiment, a four bit number. The bit which indicates whether the entry includes data or not is utilized to allow sectors to be created without data. Other information may also be stored in a header in a particular embodiment. For example, in one embodiment, a byte indicating the length of the sector is stored in the attribute field.

The pointer value points to a physical address on the block 34 (an offset from the beginning physical address on the block) at which the first byte of the data for logical sector 58112 is stored. An arrow in FIG. 3 illustrates this physical position at which the first byte of data for the logical sector 58112 are stored. Since the amount of data to be stored is known at the time of a write operation, in one embodiment of the block 34, the data is stored by writing down to the next previously stored data. In the case of logical sector 58112 which is the first sector on the block 34, the data is written commencing with the address stored as the offset associated with the sector number 58112 to a point at the beginning of the data area which is marked by a beginning pointer value illustrated by an arrow extending from the upper left had corner of the block 34.

The mount of data written to the logical sector 58112 is not fixed and may vary. However, in the typical interface between the host computer system and the storage system, data is assigned to storage in sectors of 512 bytes. FIG. 3 shows a second logical sector 5 and its pointer directed to a physical position on the block 34 which stores the first byte of the data for sector 5. The data for sector 5 is stored in an area which begins just above the most recent data sector written (sector 58112) and extends downward so that the last row of the new data sector lies in the row just above the first row of sector 58112. FIG. 3 also shows the header for a sector 867. This sector is written without data (WOD). Since the data for each new sector is written in all of the rows immediately above the data for the last-written sector, only a trivial mount of data space (averaging one byte) is wasted in the block storage scheme of the arrangement. When the data being sent to storage is compressed, the mount of storage space normally left empty in a fixed size storage arrangement may be eliminated. This should be contrasted with the very large mount of unused space typical to an apparently full hard disk.

In one embodiment, the data stored in any sector of the block 34 may be retrieved by going to the header for the sector and retrieving the pointer to the beginning position of the data and the pointer to the beginning position of the sector whose number is stored immediately preceding the sector number being retrieved. These two values determine the starting and ending positions for the data which is sought in the sector. In the embodiment referred to above which includes an attribute byte indicating the length of the sector, only one access is necessary to retrieve both the pointer to the beginning position of the data and the byte containing the length of the sector. As was pointed out above, the logical sector number is stored in a lookup table 30 (which in one embodiment is held in static random access memory 31 on the circuit board which holds the other components of the array 20) with the physical position of the header including the chip number, the block, and the header offset value. This lookup table 30 is maintained by the microprocessor 25 of the control circuit 24.

The unusual arrangement for rewriting data used by a flash memory array requires that the memory allocation system continually make new or newly-erased free memory space available for data to be written and rewritten. This requires that some number of blocks of the array always be available in order to allow blocks holding dirty data to be cleaned up and their dirty sectors released.

A problem which occurs in the operation of any memory array is that attempts to read, write, and erase that memory sometimes fail. Failures may occur for many reasons. Failures may be due to the physical failure of the array or caused by some form of extraneous signal. Failures of an array which reoccur and cause the array not to write, read, or erase correctly cannot be tolerated; and the offending portion of the array must be removed from operation while extraneous errors which do not repeat do not require this result.

With typical electro-mechanical hard disks, a test is run before a disk is placed in operation to determine if bad sectors exist. Those individual sectors which are found are marked as bad in a table recorded on the disk. Since a flash memory array utilizes logical sectors which vary in both size and physical location from sector to sector and cleanup to cleanup, a typical disk drive method of marking bad sectors would be very difficult to implement. Consequently, if a portion of an array is found to be producing multiple unique errors, the entire block of the array is removed from operation. A block is capable of storing 250 sectors of data. The removal of any bad block creates a difficult situation since it reduces the number of blocks of the array which are available for the cleanup of dirty blocks. Without these extra blocks, the array could fill to the point that cleanup would be unable to provide space for new or updated data as that data is written. Consequently, especially conservative processes for correcting operational errors must be implemented to preclude removing any blocks from the array unnecessarily.

Figure 4:
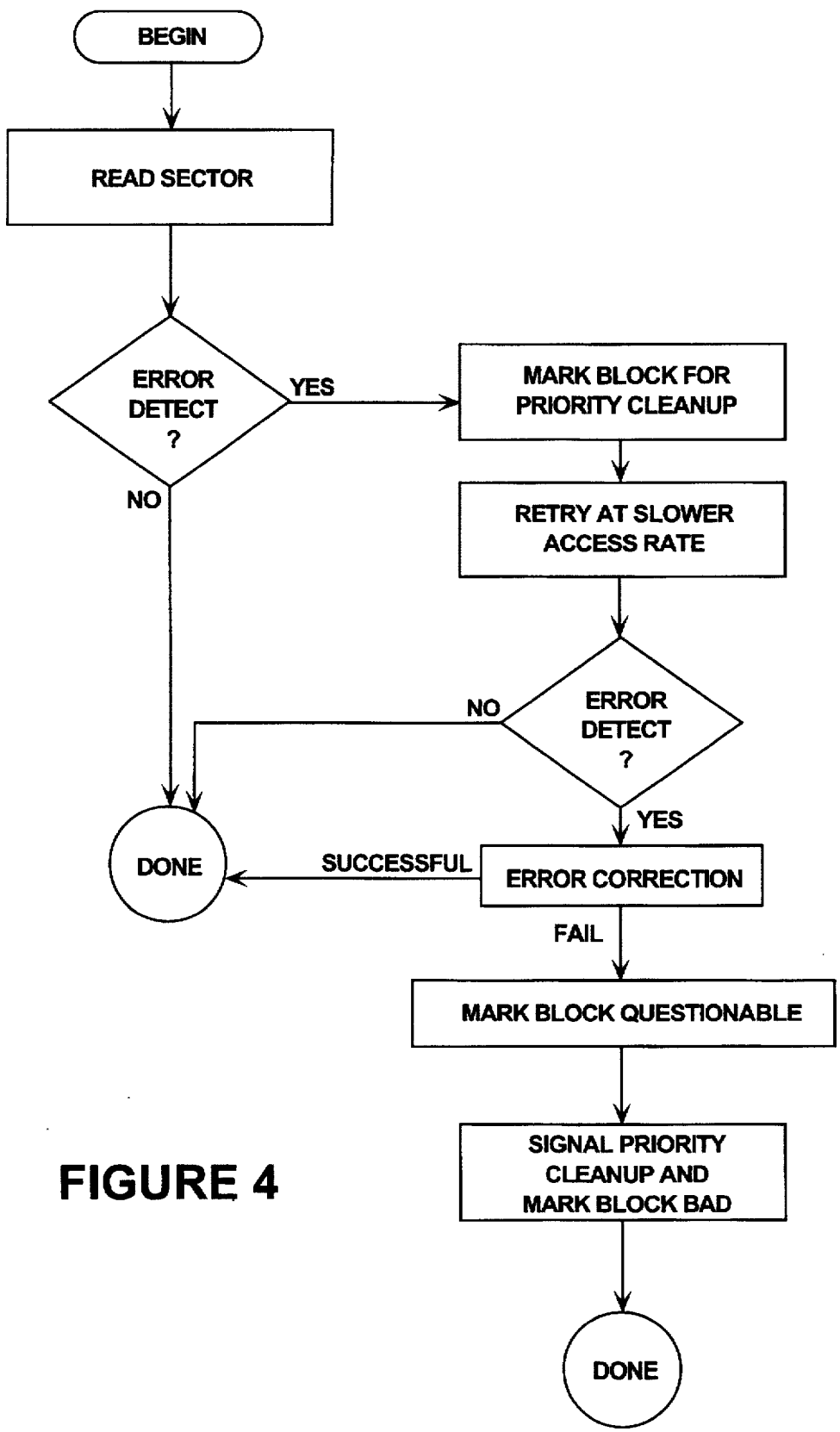
FIG. 4 is a flow chart illustrating a method in accordance with the present invention for handling defects detected during read operations in a flash memory array.

Various methods of detecting defects which are considered to render a block bad and therefore unusable are described in U.S. patent application Ser. No. 07/969,749, entitled Method of Managing Defects in Flash Disk Memories, S. Wells et al, filed Oct. 30, 1992, and assigned to the assignee of the present invention. FIG. 4 illustrates a read defect detection process which is described in that patent application. Typically, such a process is implemented in software stored in read only memory 26 and carried out by the microprocessor 25 which is a part of the controller 24. The process begins at a first step at which an attempt is made to read data from a sector. The entire sector is read, and then the data is transferred to an error detection circuit 42 which is part of the control circuit 24. The error detection circuit 42 utilizes four bytes of error detection and correction code stored with the data in the sector to detect whether an error has occurred. In one embodiment of the invention, the error detection and correction code allows detection of single and multiple bit errors. Examples of error detection and correction code and the operations which may be performed using such code are described in general in the last-mentioned patent application and are detailed, for example, in *Practical Error Correction Design For Engineers*, Revised 2d Edition, Glover and Trent, published by Cirrus Logic Press, copyright 1990.

If no error has been detected during the error detection step in FIG. 4, then the process immediately steps to a done condition and no further steps are required. The data read from the sector may be utilized by the host.

If an error is detected during the error detection step, the process moves to a step at which the block is marked for priority cleanup so that the valid data will be moved to another block and the block will be erased on a priority basis. The marking is accomplished by the generation of a signal by the error detection circuit which informs the read defect detection process of the detection of the error. The read defect detection process then generates a signal which is used to mark a cleanup data structure 36 kept by the microprocessor of the control circuit 24 for the cleanup process in the random access memory 31. The data structure 36 indicates the address of the particular block and that the particular block is to be cleaned up on a priority basis. The cleanup process signals the read defect detection process that it has received the signal and will attend to it whenever that process is activated. The cleanup process is described in detail in U.S. patent application Ser. No. 07/969,760, entitled A Method Of Cleaning Up A Solid State Memory Disk Storing Floating Sector Data, S. Wells et al, filed on Oct. 30, 1992, and assigned to the assignee of the present invention.

After marking the block for priority cleanup, the process moves to a step at which an attempt is made to reread the data in the sector. A much slower read rate is used than in the first read attempt because most read errors in a flash EEPROM memory array are caused by the extended time required after a large number of switching operations for a memory cell to settle to a level at which data may be read. The data is perfectly good and may be read from the sector if a method is found to slow the read operation for such a sector. A circuit for automatically accomplishing a slow read operation when a read error is detected is disclosed in U.S. patent application Ser. No. 969,756, entitled Method and Apparatus To Improve Read Reliability in Semiconductor Memories, S. Wells et al, filed on Oct. 30, 1992, and assigned to the assignee of the present invention. If on such a retry of the read operation the information is read without error, the process is finished; and the error is considered to be non-repeatable and is simply ignored. Because of the built in process for slowing the read operation, data may continue to be written to and read from the area of the array. Since no loss of data will occur using this area and the block with the error is already marked for a priority cleanup, the block is left as an operating portion of the array.

If, however, a second error occurs on the attempt to reread, it is then known that the error is not one which a slower read operation will cure. Consequently, the process moves to a step at which a software error correction process run on the microprocessor 25 of the control circuit 24 attempts error correction using the four bytes of error detection and correction data stored with each sector of information. The correction may be carried out in a manner which is well know to the prior art and is detailed in the patent application entitled Method of Managing Defects in Flash Disk Memories, described above. This four bytes of error correction information allows the correction of single and multiple bit errors which may occur in the attempt to read the particular sector. If the correction is successful, the process is complete.

If, however, the error correction operation fails and the data cannot be recovered, this indicates that the type of error is not a single or multiple bit error for which the correction code and circuitry can be expected to produce valid data. Consequently, the error correction process generates a signal indicating the failure to correct. The signal causes the read defect detection process to generate a signal to the cleanup data structure 36 used by the cleanup process to both mark the block for priority cleanup and then, after the cleanup, to mark the block as bad. This has the effect of alerting the background cleanup operation to move the valid data from the block and, finally, mark the block as bad and not to be used.

In the prior arrangement, a block is marked bad by placing an indication in a 240 bit space 37 (one bit for each of the 240 blocks) of the block data structure 35 (at the bottom of the rectangle of FIG. 3) of block zero of each of the chips making up the array 20. Each bit of the 240 bit space 37 indicates the defect condition of one block of the array. In one embodiment, a one value for the bit indicates that the block is good while a zero indicates the block is bad. This marking of a 240 bit space 37 of each block zero on each chip thus indicates all of the good and bad blocks in the array. Each bit of the 240 bit space 37 stores the indication that a block is good or bad in a plurality of 240 bit spaces (fifteen 240 bit spaces in one embodiment with fifteen chip pairs) all but one of which must be apart from the particular block which is marked bad by the indication (and which may therefore not be relied upon to correctly store the indication of its faulty condition). Polling by the controller 24 of the 240 bit spaces 37 of the block data structure 35 of all block zeroes on all of the chips and using a majority of the bits assigned to any block to indicate whether a particular block is bad or not provides an accurate indication of the status of any block. The polling is accomplished on system power up by scanning the 240 bad bit spaces 37 of each block zero and counting the number of bad block indications for each of the 240 blocks. In the embodiment described in the earlier patent application, a majority rule is used to indicate that a block is bad.

Similarly, processes for detecting bad blocks encountered during write and erase processes are disclosed in the aforementioned patent application. Each of these processes marks a block as bad and unusable in the 240 bit space 37 of the block zero on each of the chips of the array 20. One distinction between the read and write process for detecting errors is that the write process uses questionable markings. For a first write error to a block, a first two byte questionable area 38 of the block data structure area 35 is marked with the offset number of the faulty sector and the sector is marked for cleanup. If a block shows another write error at a different location, a second questionable area 39 of the block status table is marked with the offset number of this second questionable area of the block. This accumulation of two questionable marks indicates that the block has failed and causes the write defect process to signal the cleanup process (using the cleanup data structure) for a priority cleanup operation and to mark the block bad after the cleanup in the 240 bit bad block space 37 of the block data structure areas 35 of all the zero blocks.

Figure 5:
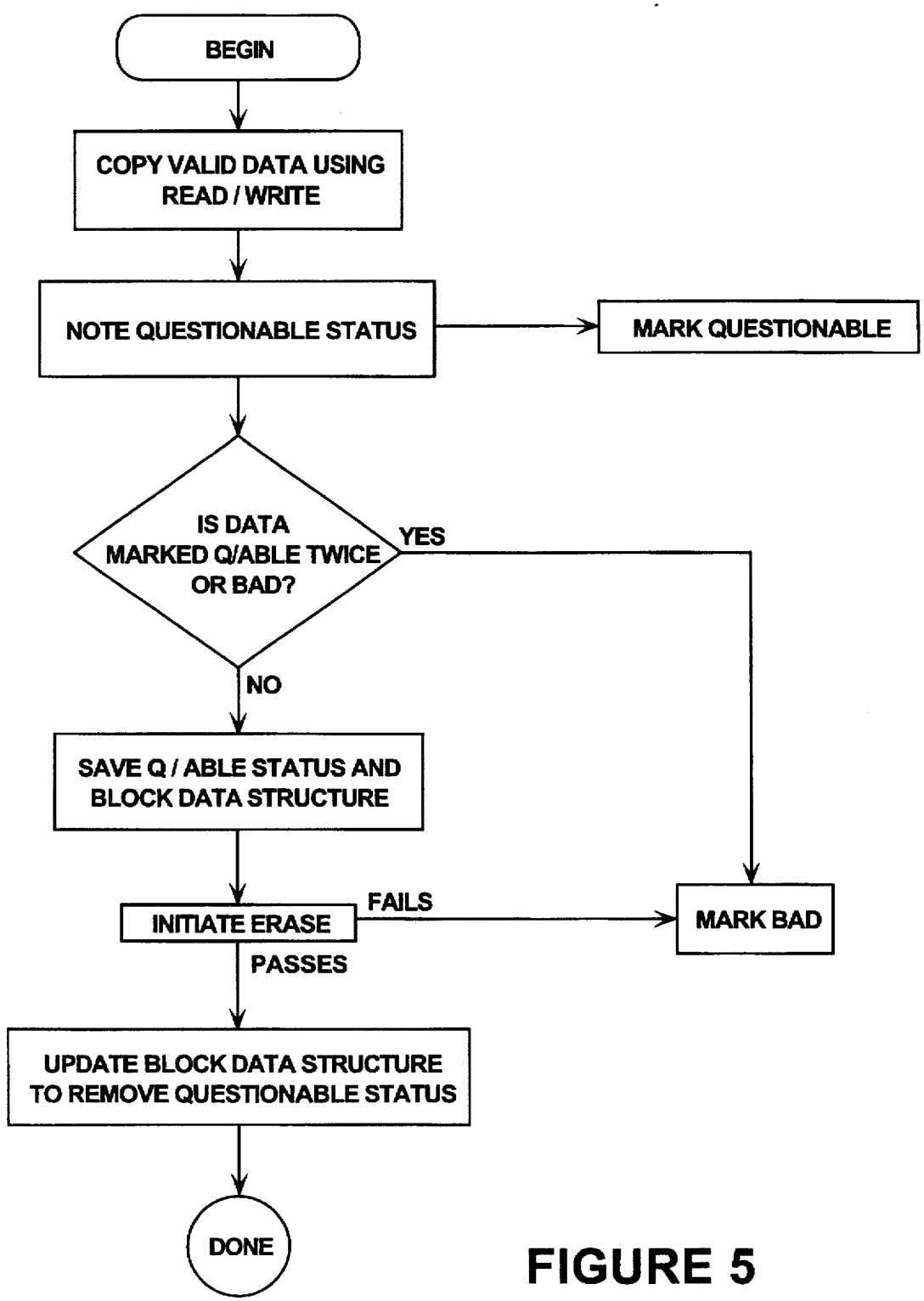
FIG. 5 is a flow chart illustrating a method for a cleanup process used in a flash memory array.

FIG. 5 illustrates a process run by the microprocessor of the control circuit 14 whenever the cleanup process is run to clean up blocks which are bad or questionable. The cleanup process occurs whenever a block is to be erased so that the excess memory available in its dirty sectors may be released for use by the system. The details of the selection of particular blocks to be cleaned up and the particulars of reading the data and writing to free space which are accomplished by the cleanup process are disclosed in the U. S. patent application entitled A Method Of Cleaning Up A Solid State Memory Disk Storing Floating Sector Data, referred to above. In the first step of the process of FIG. 5, the process reads all of the valid sectors stored on the block and writes those valid sectors, sector by sector, to unused areas in another block. During this operation, the process notes whether the block 34 from which the data is being read has been marked questionable. If the block has either been marked questionable twice or has been marked for priority cleanup and to be marked bad, then the block is marked bad so that it will no longer be used for any read or write operations. This is accomplished by writing to the appropriate bit of the 240 bit space 37 in the block structure storage area of each block zero of each chip. If the block was not marked for priority cleanup (and to be marked bad) nor marked questionable twice, the questionable status and the block data structure are saved; and an erase is attempted. If the erase fails, this failure causes the block to be marked bad since a block which cannot be erased cannot be programed. If the erase operation is successful, the questionable status and the block data structure are restored to the erased block. The block is then placed back into service.

The prior art arrangement just described has a number of shortcomings. For example, it is often desirable and less expensive from a manufacturing stand point to utilize chips in the array 20 which include some bad blocks and simply reduce the overall storage capacity of the array; consequently, it is possible that some large number of blocks may be bad. However, if more than fifty percent of the zero blocks are bad, the polling operation on power up of the computer system will not function. Moreover, the system requires that the bad block defect information be stored on a number of blocks of the array itself, each zero numbered block of each chip in the array. As the size of the array increases, both the number of blocks holding this data and the mount of data on each block increases. The storing of defect data on the blocks of the array also means that each block whether good or bad must be read when power is applied to the system in order to accumulate the data from which the table of bad blocks is assembled. This operation requires some extra period of time at power up. This operation also requires that the addressing circuitry used to translate addresses from those provided by the host computer into those used by the controller 24 for addressing the logical sectors of the array be utilized in assembling a bad block table for accessing the array 20. If any defects exist in this addressing circuitry, these defects can affect the assembly of the bad block table. If the addressing circuitry is bad, the information regarding bad blocks cannot be recovered to determine the reasons for, or the location of, the failures in the array. Whenever a block is marked bad, a plurality of individual tables must be marked in a time consuming operation. For these and other reasons, a different arrangement and method for reliably storing defect information is desirable.

The present invention resolves all of these and other problems by storing the bad block data not on the blocks of flash memory but rather in the read only memory 26 which is associated with the controller circuit 24. By so doing, the system may read the bad block information when power is applied to the computer system and directly construct a bad block table in random access memory 31 to be used during the access of the array. The controller 24 may then access the array 20 using the bad block table in random access memory 31 without the need to address bad blocks in order to construct that bad block table. The time required to address each of the blocks zero on each chip, the area required for the bad block table on each of the blocks on each chip, and the problems caused by defects in the addressing circuitry affecting the bad block table are all eliminated by this new arrangement.

An especially unusual aspect of the present invention is that the read only memory 26 of the controller 24 is subject to modification during the operation of the circuitry of the array 20. At no other time known to the inventors has a read only memory been designed to allow it to store changing data during operation in the manner of random access memory. This is required if the read only memory 26 is to be used to store the bad block table because of the need to add blocks to the bad block table at any time bad blocks are detected during operation of the array.

Figure 6:
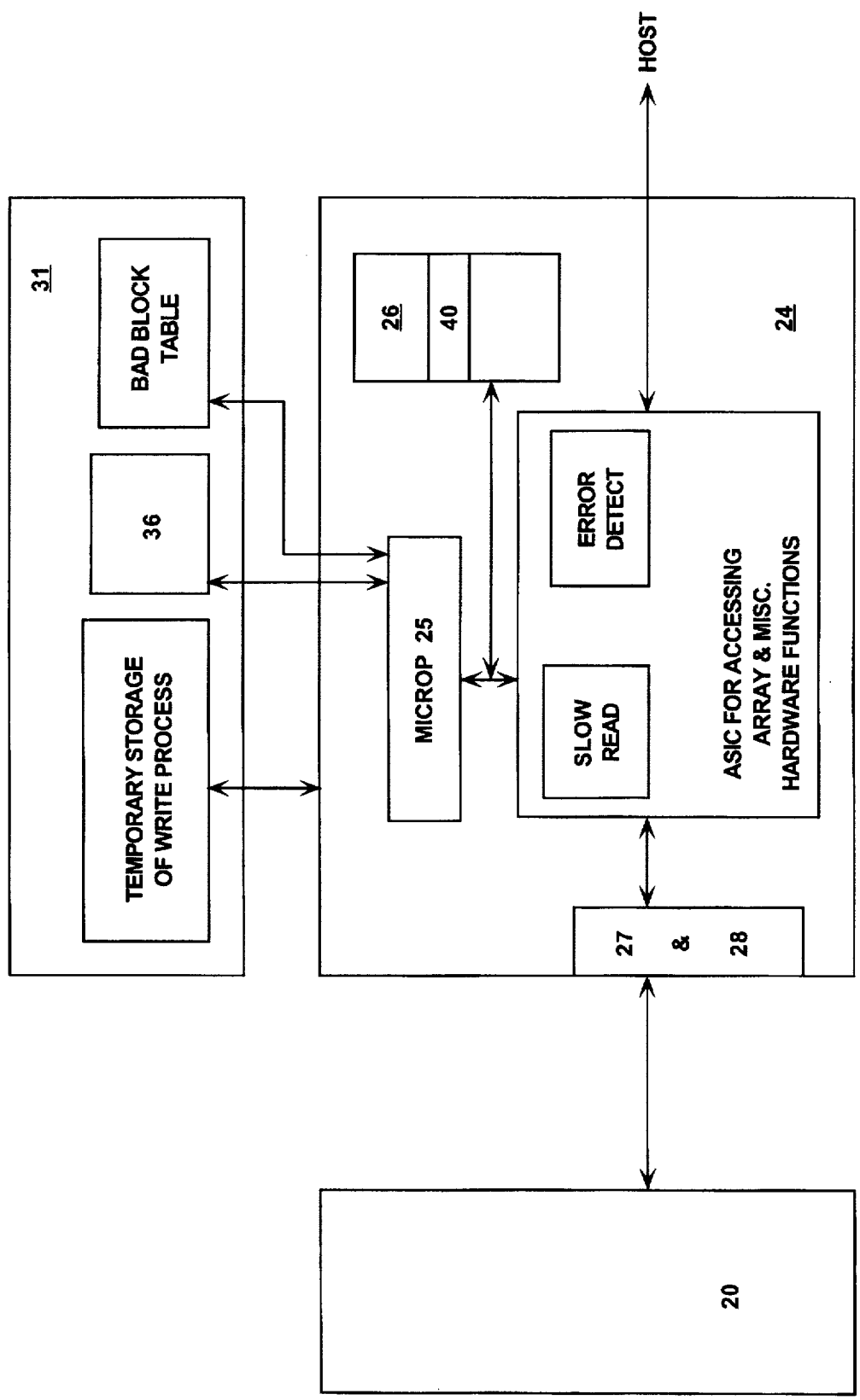
FIG. 6 is a block diagram illustrating in detail a control circuit used in the present invention.

FIG. 6 is a block diagram illustrating a controller 24 in more detail. The controller includes the microprocessor 25 and read only memory 26. As a part of manufacture, during certification of the product, the blocks of the array 20 are interrogated and bad blocks are determined. A bad block table 40 is programmed in read only memory 26 during this certification process. In one embodiment, this table 40 includes 240 bits of data. Each of these 240 bits represents one block of an array which includes fifteen chip pairs (thirty chips in all) each of which includes sixteen blocks of flash EEPROM memory. Thus, sixteen bits (one word) represent the blocks on one chip of the array 20. In one embodiment, the microprocessor is capable of addressing the read only memory 26 in word (sixteen bit) increments.

Read only memory 26 is also constructed of flash EEPROM memory transistors. Consequently, this read only memory 26 is capable of being electrically modified without removal from the computer system of which it is a part. As was pointed out above in discussing the operation of the flash EEPROM array 20, the flash memory transistors are typically placed in the one condition by an erase operation and may be written to the zero condition by a write process. They may not, however, be changed back to the one condition without a full erase operation which could not be practiced on the read only memory 26 during operation without losing the control processes. Thus, if good blocks are represented in the read only memory 26 by one values, writing a zero to a bit representing a block may be used to indicate that the block has become bad. This may be accomplished by a write process.

In fact, one of the control processes which is stored in the memory 26 is a process for writing to the memory 26. Typically the processes stored in read only memory 26 execute out of the memory 26. However, since the read only memory 26 is to be modified by this process and this modification requires that a high voltage (Vpp) be applied to the read only memory 26, this write process is read from the read only memory 26 by the microprocessor 25 and written into the random access memory 31 used for storing the various processes and data utilized in the control of the array 20. Once in the random access memory 31, the write process may be run by the microprocessor 25 and used to write to particular addresses in the memory 26. If these addresses are the particular words in the area of the memory 26 storing the bad block table for the array 20, then that table may modified. It should be noted at this point that it would be possible to use the write process in order to modify other portions of the read only memory 26. In this manner, information other than bad block information (such as information regarding other failures and anomalies) might be stored in the read only memory 26 and modified during operation of the array 20.

In order to appropriately modify the bad block table 40, the cleanup process which receives (from the defect management processes in the manner described above) the data indicating that a bad block exists, initiates the storing of the write process in the random access memory 31 and the writing of the updated bad block data to the bad block table 40 of the read only memory 26 when a bad block defect occurs. The cleanup process receives the bad block data from the defect processes which is stored in the cleanup data structure 36 and furnishes the word address and pattern of the particular word of the bad block area being modified to the write process. This word address indicates the chip containing the bad block, and the pattern in the word indicates the bad block by a zero at the bit position of the bad block. The microprocessor 25 then runs the write process to write the word to the bad block table of the read only memory 26; this causes the single bit position representing the bad block to store a zero value. During the same operation, the cleanup process modifies the bad block table stored in random access memory 31 so that the operation of the array 20 may continue without needing to pause to reconstruct the random access memory bad block table from the bad block table 40 in read only memory 26.

Figure 7:
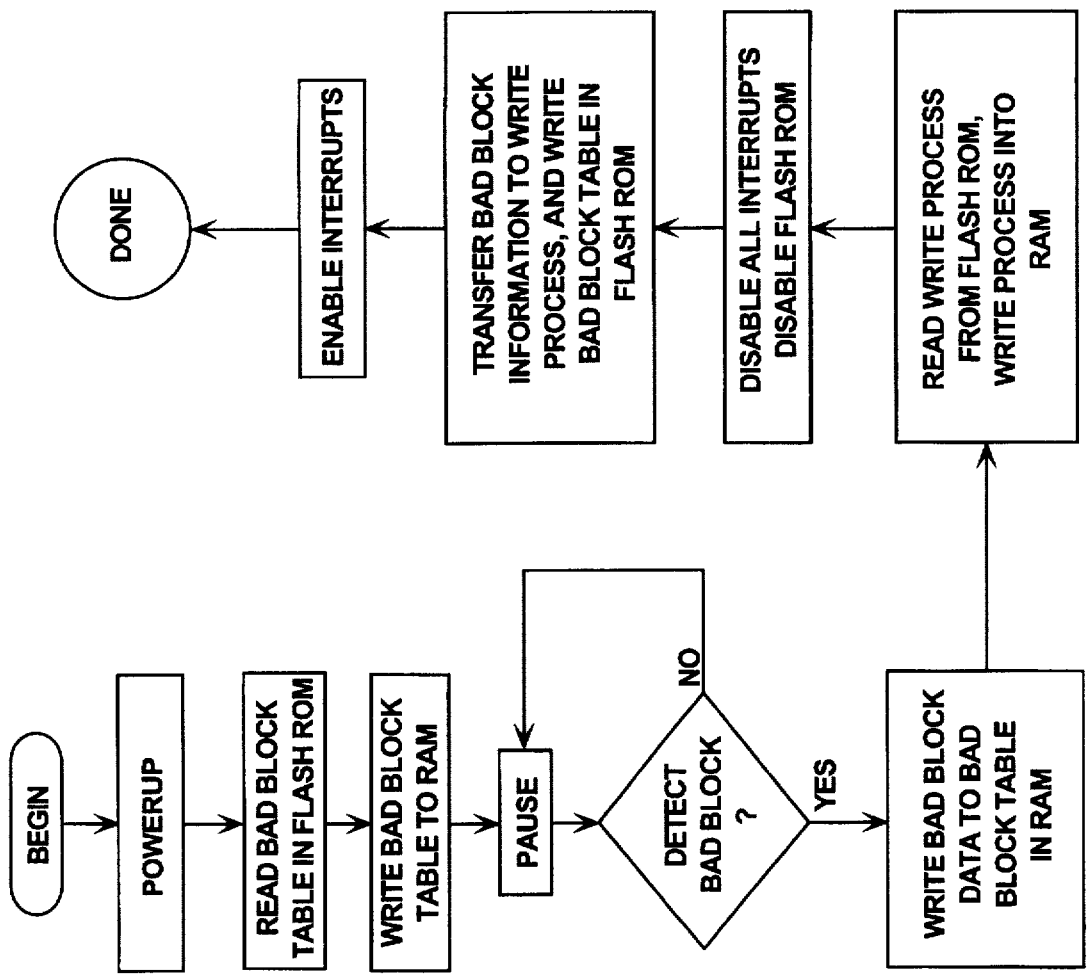
FIG. 7 is a flow chart illustrating a method in accordance with the invention for handling defects discovered during operation of the circuitry of a flash memory array.

FIG. 7 is a flow chart illustrating a process for carrying out the present invention. The process commences when power is applied to the circuitry of the array including the controller 24. At this point, the bad block table in read only memory 26 is read and written to random access memory 31. In random access memory 31, the bad block table is utilized in addressing the array 20 so that bad blocks are not addressed in reading, writing and erasing data stored in the array 20.

Once the bad block table has been constructed in random access memory 31, the process pauses and awaits the detection of a new bad block in the array 20. As was described above, bad blocks are detected by the read, write and erase defect detection processes described in general above and in detail in U.S. patent application entitled Method of Managing Defects in Flash Disk Memories, referred to above. When a bad block is detected by one of these processes and the data regarding that bad block has been transferred to the clean up process, the clean up process causes the microprocessor 25 to write the new bad block data to the bad block table in random access memory 31. The cleanup process then initiates the relocation of the write process from the read only memory 26 into random access memory 31 by the microprocessor 25. The cleanup process also transfers to the write process the address of the word to be rewritten in the read only memory 26 and the bit pattern for that word with the new bad block indicated by a zero. In one embodiment, the address includes the starting position of the bad block table in read only memory 26 and the number of the chip which includes the bad block. After the write process is written to the random access memory 31, all interrupts to the controller 24 (including non-maskable interrupts) are disabled so that an interrupt will not cause the controller to vector into the read only memory and attempt to execute instructions. The process then enables the programming of the read only memory 26 by asserting Vpp, and writes the word (which includes a zero value for the newly defective block) to the bad block table in read only memory 26 using the write process now being executed from random access memory 31 thereby updating the bad block table. Interrupts are again enabled and the process is complete.

As has been pointed out, since writing a zero to a flash memory transistor may be done without erasing the array, this write process may take place during continuing operation of the circuitry which includes the read only memory 26. This should be contrasted to other methods in which read only memory can only be modified during times when the memory is not being utilized for continuing operations. Since the bad block data is written to read only memory, the information remains when power is removed from the array and its associated circuitry. The bad block table in its corrected form is ready to be read on power up of the array and to be written to the random access memory where it may be used for accessing the array 20. Because the bad block table is stored in read only memory and apart from the blocks of the array 20 where it was stored in previous arrangements, the controller need not utilize the addressing circuitry of the array 20 in order to construct the bad block table in random access memory on power up. Thus, defects in the addressing circuits do not affect the bad block table and bad blocks need not be addressed to construct the table. Only one bad block table needs to be rewritten when a new bad block is detected instead of plurality of different bad block tables in the block structure storage area of block zero on each chip. More importantly, the prior method of polling the zero blocks on the array to determine by a majority rule whether any individual block of the array is to be considered bad or good is eliminated. The bad block table in read only memory 26 is simply read on power up, and the new bad block table used for accessing the array is constructed in random access memory 31.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A controller for controlling a flash memory array which includes a microprocessor, read only memory which contains a single bad block bitmap table and control processes to be run by the microprocessor for controlling the flash memory array, wherein the read only memory can be written from a first state to a second state without erasing the read only memory after writing to the first state, random access memory, circuitry for accessing the flash memory array, circuitry for detecting new bad blocks within the flash memory array during operation of the flash memory array subsequent to an initial determination of which blocks of the flash memory array are bad, and circuitry for writing bad block data to the bitmap table contained in the read only memory by overwriting, for each of a plurality of new bad blocks, a same portion of the bitmap table which corresponds to each of the plurality of new bad blocks without erasing the same portion of the bitmap table between each overwrite.

2. A controller for controlling a flash memory array as claimed in claim 1 in which the circuitry for writing bad block data comprises circuitry for reading a process for writing to the read only memory stored in the read only memory, and writing that process to the random access memory, and circuitry for using the process for writing to the read only memory stored in the random access memory to write any bad block data detected to the read only memory.

3. A controller for controlling a flash memory array as claimed in claim 2 further comprising circuitry for disabling interrupts before writing to the read only memory, and circuitry for enabling interrupts after writing to the read only memory has been completed.

4. A controller for controlling a flash memory array as claimed in claim 2 in which the read only memory is a flash EEPROM memory array.

5. A method for storing data which changes during the operation of a data processing system, wherein the data processing system includes a processor, read only memory which contains a bad block bitmap table, and random access memory, wherein the read only memory can be written from a first state to a second state without first erasing the read only memory after initialization to the first state, the method comprising the steps of:
 detecting bad block data to be stored in read only memory during the operation of the data processing system and after an initial storing of which blocks are bad;
 reading, from read only memory, a write process for writing data to read only memory and storing that process in random access memory; and
 running the write process for writing data to read only memory stored in random access memory to write the bad block data to the bad block bitmap table, wherein the write process overwrites, for each of a plurality of bad block data, a same portion of the bitmap table which corresponds to each of the plurality of bad block data without first erasing the same portion of the bad block bitmap table before the overwrite.

6. A method for storing data which changes during the operation of a data processing system as claimed in claim 5 further comprising the step of disabling all interrupts including non-maskable interrupts before running the write process stored in random access memory to write the bad block data to read only memory.

7. A process for updating read only memory in a controller circuit, wherein the controller circuit includes a microprocessor, read only memory, and random access memory, wherein the read only memory can be written from a first state to a second state without first erasing the read only memory between the first state and the second state, the process comprising the steps of:
 detecting changes to be made in bad block data previously stored in read only memory, after an initial evaluation of each block of the read only memory to determine which blocks are bad;
 reading a write process stored in read only memory and writing that process to random access memory; and executing the write process stored in random access memory to update a bad block bitmap table, stored in read only memory, by writing the changes to be made in the bad block data stored in the bad block bitmap table by overwriting, for each of a plurality of bad block data, a same portion of the bad block bitmap table which corresponds to each of the plurality of bad block data without first erasing the same portion of the bad block bitmap table.

8. A computer system comprising a central processing system, main memory, a system bus coupling the central processing system and main memory, and at least one additional component coupled to the system bus, the additional component comprising:

read only memory which contains a bad block bitmap table and control processes, random access memory, first circuitry controlled by the control processes, wherein the read only memory can be written from a first state to a second state without first erasing the read only memory, subsequent to obtaining the first state, and second circuitry for writing new bad block data detected in the first circuitry during running of the control processes to the bad block bitmap table contained in the read only memory during the continuing operation of the computer system and subsequent to an initial determination of which blocks are bad, by overwriting, for each of a plurality of new bad block data, a same portion of the bitmap table which corresponds to each of the new bad blocks without first erasing the same portion of the bad block bitmap table.

9. A computer system as claimed in claim 8 in which the second circuitry comprises a microprocessor, and circuitry for causing the microprocessor to disable interrupts to the additional component and write the bad block data to the read only memory.

10. A computer system as claimed in claim 8 in which the read only memory is a flash EEPROM memory array.

11. A method for managing data in a first flash electrically erasable programmable read only memory (EEPROM) memory array which array is divided into a plurality of blocks of memory cells each of which is separately and individually erasable, the method comprising the steps of:

detecting new bad blocks during the operation of the first flash EEPROM memory array, after an initial determination of which blocks are bad;

writing new bad block data corresponding to the new bad blocks to a bad block bitmap table in random access memory; and writing the new bad block data to a bad block bitmap table in a second flash EEPROM array, wherein the second flash EEPROM array can be changed from a first state to a second state without first erasing the second flash EEPROM array between the change from the first state to the second state, and wherein the second flash EEPROM array is separate from the first flash EEPROM array, and wherein the new bad block data is written to the bad block bitmap table by changing a single bit in the bad block bitmap table corresponding to the new bad block by overwriting, for each of a plurality of new bad blocks, a same portion of the bitmap table which corresponds to each of the plurality of new bad blocks without first erasing the same portion of the bad block bitmap table.

12. A method for managing data in a first flash EEPROM memory array as claimed in claim 11 in which the step of writing new bad block data comprises the steps of:

reading a write process for writing data to read only memory which process is stored in the second flash EEPROM array and storing that process in random access memory; and running the write process stored in random access memory to write the new bad block data to the second flash EEPROM array.

13. A method for managing data in a first flash EEPROM memory array as claimed in claim 11 further comprising the step of disabling all interrupts including non-maskable interrupts before running the write process stored in random access memory to write the new bad block data to the second flash EEPROM array.

14. A method for managing data in a first flash EEPROM memory array as claimed in claim 11 further comprising the steps of:

reading a bad block table stored in the second flash EEPROM array when power is furnished to the first flash EEPROM memory array; and writing a bad block table in random access memory from the data read from the bad block table stored in the second flash EEPROM array.

15. A method for managing data in a first flash EEPROM memory array as claimed in claim 13 further comprising the steps of:

reading a bad block table stored in the second flash EEPROM array when power is furnished to the first flash EEPROM memory array; and writing the bad block table in random access memory from the data read from the bad block table stored in the second flash EEPROM array.

16. A controller for controlling a flash memory array, the controller comprising:

a random access memory;

a read only memory which contains a bad block bitmap table, wherein the bad block bitmap table includes a plurality of bits, each bit of the plurality of bits indicating whether a single block of the flash memory array is bad, the read only memory being coupled to the random access memory, wherein the read only memory can be changed from a first state to a second state without first erasing the read only memory between the change from the first state to the second state; and a microprocessor, coupled to the read only memory, configured to write bad block data detected during the operation of the flash memory array and after an initial determination of which blocks of the flash memory array are bad to the bad block bitmap table by overwriting, for each of a plurality of new bad blocks, a portion of the bitmap table which corresponds to each of the plurality of new bad blocks without erasing the portion of the bitmap table between each overwrite.

17. The controller of claim 16, wherein the read only memory is a flash EEPROM memory array.

* * * * *